(12) United States Patent
Wyatt et al.

(10) Patent No.: US 7,907,409 B2
(45) Date of Patent: Mar. 15, 2011

(54) SYSTEMS AND METHODS FOR COOLING A COMPUTING COMPONENT IN A COMPUTING RACK (75) Inventors: William G. Wyatt, Plano, TX (US); Richard M. Weber, Prosper, TX (US)

(73) Assignee: Raytheon Company, Waltham, MA (US)

( * ) Notice: Subject to any disclaimer, the term of this patent is extended or adjusted under 35 U.S.C. 154(b) by 0 days.

(21) Appl. No.: 12/406,645

(22) Filed: Mar. 18, 2009

(65) Prior Publication Data

US 2009/0244830 A1    Oct. 1, 2009

Related U.S. Application Data (60) Provisional application No. 61/039,376, filed on Mar. 25, 2008.

(51) Int. Cl.
*H05K 7/20* (2006.01)
(52) U.S. Cl. .......... 361/700; 165/80.4; 165/104.26; 174/15.2
(58) Field of Classification Search .......... None
See application file for complete search history.

(56) References Cited

U.S. PATENT DOCUMENTS

| | | | |
|---|---|---|---|
| 1,528,619 A | 3/1925 | Koenig | |
| 1,906,422 A | 5/1933 | Roulton | |
| 2,321,964 A | 6/1943 | Zieber | 62/115 |
| 2,371,443 A | 3/1945 | Hillier | 122/451 |
| 2,991,978 A | 7/1961 | Jones | 257/45 |
| 3,131,548 A | 5/1964 | Chubb et al. | 62/150 |
| 3,174,540 A | 3/1965 | Dutton | 165/105 |
| 3,332,435 A | 7/1967 | Anderson et al. | 137/394 |
| 3,334,684 A | 8/1967 | Roush et al. | 165/47 |
| 3,371,298 A | 2/1968 | Narbut | 336/57 |
| 3,586,101 A | 6/1971 | Chu | 165/101 |
| 3,609,991 A | 10/1971 | Chu et al. | 62/333 |
| 3,731,497 A | 5/1973 | Ewing | 62/160 |
| 3,756,903 A | 9/1973 | Jones | 161/39 |
| 3,774,677 A | 11/1973 | Antonetti | 165/39 |

(Continued)

FOREIGN PATENT DOCUMENTS

DE    1220952    3/1968

(Continued)

OTHER PUBLICATIONS

PCT Notification of Transmittal of the International Search Report and the Written Opinion of the International Searching Authority, or the Declaration, PCT/US2009/037912, dated Jun. 22, 2009.

(Continued)

*Primary Examiner* — Boris L Chervinsky
(74) *Attorney, Agent, or Firm* — Baker Botts L.L.P.

(57) ABSTRACT

According to one embodiment, a system for cooling computing components includes a computing rack housing a plurality of computing components of a computing system. A heat absorbing plate is disposed in and removable from the computing rack. The heat absorbing plate is thermally coupled to an outer surface of a computing component and comprises a plurality of walls defining a cavity containing a two-phase coolant. The cavity has a continuous volume allowing the two-phase coolant to absorb heat from the computing component and to transfer the heat to a heat transfer mechanism. The computing rack has a sidewall that is thermally coupled to the heat absorbing plate and comprises the heat transfer mechanism, which is operable to receive the heat transferred from the heat absorbing plate.

22 Claims, 5 Drawing Sheets

U.S. PATENT DOCUMENTS

| | | | | |
|---|---|---|---|---|
| 3,989,102 | A | 11/1976 | Jaster | 165/107 |
| 4,003,213 | A | 1/1977 | Cox | 62/124 |
| 4,019,098 | A | 4/1977 | McCready | 361/385 |
| 4,072,188 | A | 2/1978 | Wilson et al. | 165/80 |
| 4,129,180 | A | 12/1978 | Larinoff | 165/113 |
| 4,169,356 | A | 10/1979 | Kingham | 62/85 |
| 4,295,341 | A | 10/1981 | Gale | 62/100 |
| 4,296,455 | A | 10/1981 | Leaycraft | 361/383 |
| 4,330,033 | A | 5/1982 | Okada | 165/104.27 |
| 4,381,817 | A | 5/1983 | Brigida | 165/110 |
| 4,411,756 | A | 10/1983 | Bennett et al. | 204/176 |
| 4,495,988 | A | 1/1985 | Grossman | 165/96 |
| 4,511,376 | A | 4/1985 | Coury | 55/36 |
| 4,585,054 | A | 4/1986 | Koprunner | 165/112 |
| 4,638,642 | A | 1/1987 | Tokuno | 62/498 |
| 4,691,532 | A | 9/1987 | Reid et al. | 62/476 |
| 4,794,984 | A | 1/1989 | Lin | 165/133 |
| 4,843,837 | A | 7/1989 | Ogawa et al. | 62/324.1 |
| 4,851,856 | A | 7/1989 | Altoz | 343/720 |
| 4,938,280 | A | 7/1990 | Clark | 165/80.4 |
| 4,945,980 | A | 8/1990 | Umezawa | 165/101 |
| 4,998,181 | A | 3/1991 | Haws | 361/385 |
| 5,021,924 | A | 6/1991 | Kieda et al. | 361/385 |
| 5,086,829 | A | 2/1992 | Asakawa | 165/12 |
| 5,128,689 | A | 7/1992 | Wong | 343/853 |
| 5,148,859 | A | 9/1992 | Beamer | 165/41 |
| 5,161,610 | A | 11/1992 | Leidinger | 165/41 |
| 5,168,919 | A | 12/1992 | Berenholz | 165/80.4 |
| 5,183,104 | A | 2/1993 | Novotny | 165/104.33 |
| 5,239,443 | A | 8/1993 | Fahey | 361/689 |
| 5,245,839 | A | 9/1993 | Chang | 62/292 |
| 5,261,246 | A | 11/1993 | Blackmon | 62/85 |
| 5,262,587 | A * | 11/1993 | Moser | 174/15.1 |
| 5,283,715 | A | 2/1994 | Carlsten et al. | |
| 5,333,677 | A | 8/1994 | Molivadas | 165/32 |
| 5,353,865 | A | 10/1994 | Adiutori | 165/133 |
| 5,398,519 | A | 3/1995 | Weber et al. | 62/201 |
| 5,404,272 | A | 4/1995 | Lebailly et al. | |
| 5,406,807 | A | 4/1995 | Ashiwake et al. | 62/376 |
| 5,414,592 | A * | 5/1995 | Stout et al. | 361/704 |
| 5,464,325 | A | 11/1995 | Albring | 416/185 |
| 5,493,305 | A | 2/1996 | Wooldridge | 342/368 |
| 5,497,631 | A | 3/1996 | Lorentzen | 62/115 |
| 5,501,082 | A | 3/1996 | Tachibana et al. | 62/149 |
| 5,509,468 | A | 4/1996 | Lopez | 165/144 |
| 5,515,690 | A | 5/1996 | Blackmon | 62/85 |
| 5,522,452 | A | 6/1996 | Mizuno | 165/40 |
| 5,605,054 | A | 2/1997 | Chen | 62/195 |
| 5,701,751 | A | 12/1997 | Flores | 62/169 |
| 5,761,037 | A | 6/1998 | Anderson | 361/700 |
| 5,815,370 | A | 9/1998 | Sutton | 361/699 |
| 5,818,692 | A | 10/1998 | Denney | 361/699 |
| 5,841,564 | A | 11/1998 | McDunn | 359/161 |
| 5,862,675 | A | 1/1999 | Scaringe | 62/193.3 |
| 5,910,160 | A | 6/1999 | Caakmackci | 62/195 |
| 5,940,270 | A | 8/1999 | Puckett | 361/699 |
| 5,943,211 | A | 8/1999 | Havey et al. | 361/699 |
| 5,950,717 | A | 9/1999 | Fay | 165/113 |
| 5,960,861 | A | 10/1999 | Price et al. | 165/80.3 |
| 6,018,192 | A | 1/2000 | Root | 257/714 |
| 6,038,873 | A | 3/2000 | Koo | 62/196.4 |
| 6,052,284 | A | 4/2000 | Suga | 361/699 |
| 6,052,285 | A | 4/2000 | Hileman | 361/699 |
| 6,055,154 | A | 4/2000 | Azar | 361/688 |
| 6,205,803 | B1 | 3/2001 | Scaringe | 62/259.2 |
| 6,292,364 | B1 | 9/2001 | Fitzgerald | 361/699 |
| 6,297,775 | B1 | 10/2001 | Haws et al. | 343/700 |
| 6,305,463 | B1 | 10/2001 | Salmonson | 165/80.3 |
| 6,347,531 | B1 | 2/2002 | Roberts | 62/612 |
| 6,349,760 | B1 | 2/2002 | Budelman | 165/80.4 |
| 6,366,462 | B1 | 4/2002 | Chu | 361/699 |
| 6,415,619 | B1 | 7/2002 | Bash | 62/228.4 |
| 6,498,725 | B2 | 12/2002 | Cole et al. | 361/700 |
| 6,519,955 | B2 | 2/2003 | Marsala | 62/119 |
| 6,529,377 | B1 | 3/2003 | Nelson | 361/699 |
| 6,536,516 | B2 | 3/2003 | Davies | 165/170 |
| 6,571,569 | B1 | 6/2003 | Rini et al. | 62/259.2 |
| 6,594,479 | B2 | 7/2003 | Ammar | 455/347 |
| 6,603,662 | B1 | 8/2003 | Ganrot | 361/698 |
| 6,608,751 | B2 * | 8/2003 | Ishimine et al. | 361/679.55 |
| 6,625,023 | B1 | 9/2003 | Morrow et al. | 361/700 |
| 6,679,081 | B2 | 1/2004 | Marsala | 62/259 |
| 6,687,122 | B2 | 2/2004 | Monfarad | 361/687 |
| 6,708,511 | B2 | 3/2004 | Martin | 62/201 |
| 6,796,372 | B2 * | 9/2004 | Bear | 165/104.21 |
| 6,827,135 | B1 | 12/2004 | Kramer | 165/104.27 |
| 6,828,675 | B2 | 12/2004 | Memory et al. | 257/714 |
| 6,873,528 | B2 * | 3/2005 | Hulan et al. | 361/719 |
| 6,952,345 | B2 * | 10/2005 | Weber et al. | 361/699 |
| 6,952,346 | B2 | 10/2005 | Tilton | 361/699 |
| 6,957,550 | B2 * | 10/2005 | Wyatt et al. | 62/475 |
| 6,967,841 | B1 * | 11/2005 | Chu et al. | 361/700 |
| 6,972,365 | B2 * | 12/2005 | Garner | 174/16.3 |
| 6,976,527 | B2 | 12/2005 | Kirshberg | 165/104.33 |
| 6,993,926 | B2 | 2/2006 | Rini et al. | 62/259.2 |
| 7,000,691 | B1 | 2/2006 | Weber | 165/281 |
| 7,017,358 | B2 | 3/2006 | Wayburn et al. | 62/115 |
| 7,110,260 | B2 | 9/2006 | Weber et al. | 361/700 |
| 7,133,283 | B2 * | 11/2006 | Faneuf et al. | 361/689 |
| 7,193,850 | B2 * | 3/2007 | Pal | 361/700 |
| 7,227,753 | B2 | 6/2007 | Weber et al. | 361/700 |
| 7,240,494 | B2 | 7/2007 | Akei | 62/3.2 |
| 7,254,957 | B2 | 8/2007 | Weber et al. | 62/259.2 |
| 7,414,843 | B2 | 8/2008 | Joshi et al. | 361/699 |
| 7,508,670 | B1 * | 3/2009 | Thorson et al. | 361/699 |
| 7,607,475 | B2 | 10/2009 | Weber | 165/281 |
| 7,626,820 | B1 * | 12/2009 | Konshak et al. | 361/700 |
| 2002/0124585 | A1 | 9/2002 | Bash et al. | 62/228.4 |
| 2003/0042003 | A1 | 3/2003 | Novotny et al. | 165/47 |
| 2003/0053298 | A1 | 3/2003 | Yamada et al. | 361/728 |
| 2003/0062149 | A1 | 4/2003 | Goodson | 165/104.11 |
| 2004/0231351 | A1 | 11/2004 | Wyatt | 62/259.2 |
| 2005/0262861 | A1 | 12/2005 | Weber | 62/259.2 |
| 2005/0274139 | A1 | 12/2005 | Wyatt | 62/498 |
| 2006/0044760 | A1 | 3/2006 | Pal | |
| 2007/0119199 | A1 | 5/2007 | Weber et al. | 62/259.2 |
| 2007/0209782 | A1 | 9/2007 | Wyatt | 165/76 |
| 2008/0158817 | A1 | 7/2008 | Tsunoda et al. | 361/697 |
| 2008/0229780 | A1 | 9/2008 | Wyatt | 62/502 |
| 2008/0291629 | A1 | 11/2008 | Ali | 361/700 |
| 2009/0077981 | A1 | 3/2009 | Wyatt | 62/3.7 |
| 2010/0001141 | A1 * | 1/2010 | Jondeau et al. | 244/158.1 |

FOREIGN PATENT DOCUMENTS

| | | |
|---|---|---|
| EP | 0 243 239 A1 | 4/1987 |
| EP | 02 51 836 A1 | 5/1987 |
| EP | 0 817 263 A2 | 10/1991 |
| EP | 0 666 214 A1 | 8/1995 |
| EP | 1 054 583 | 11/2000 |
| EP | 1 143 778 A1 | 10/2001 |
| EP | 1380 799 A2 | 5/2003 |
| EP | 1 381 083 A2 | 1/2004 |
| EP | 1 448 040 A2 | 8/2004 |
| EP | 1 601 043 A2 | 8/2004 |
| EP | 1 627 192 B1 | 1/2008 |
| FR | 2 730 556 A1 | 2/1995 |
| JP | 4-316972 | 9/1992 |
| WO | WO 00/65890 | 2/2000 |
| WO | WO 02/23966 | 3/2002 |
| WO | WO 2007/102978 | 9/2007 |

OTHER PUBLICATIONS

Notification of Transmittal of The International Search Report and The Written Opinion of the International Searching Authority, or the Declaration; PCT/US2007/004146; dated Jul. 31, 2007; (6 pgs).
EP Search Report Communication dated May 4, 2005 for European Patent Application No. EP 04256509.3; Ref. JL4707; (5 pgs).
EP Search Report dated Mar. 4, 2005 for European Patent Application No. EP 04256509.3-2220; Ref. JL4707 (4 pgs).
Notification of Transmittal of the International Search Report and the Written Opinion of the International Searching Authority, or the Declaration Int'l Application No. PCT/US2005/1020544; date of mailing: Oct. 10, 2005; Int'l filing date Jun. 10, 2005; (4 pgs.).
PCT "International Search Report", Int'l Application No. PCT/US2005/020544; Earliest Priority Date: Jun. 14, 2004: Int'l filing date: Jun. 10, 2005; (5 pgs).

EPO Communication re: Search Report dated Nov. 3, 2004 for Patent No. 03254285.4-2301; Reference No. JL3847 (5 pg).
EPO Communication re: Search Report dated Oct. 25, 2004 for Patent No. 03254283.9-2203; Reference No. JL3846 (3 pgs).
PCT Notification of Transmittal of The International Search Report and the Written Opinion of the Int'l Searching Authority, or the Declaration dated Sep. 27, 2004 for PCT/US2004/015086 (15 pgs).
PCT "Written Opinion of the International Searching Authority," Int'l Application No. PCT/US2005/020544; Earliest Priority Date: Jun. 14, 2004; Int'l filing date: Jun. 10, 2005; International Patent Classification: F25B43/04; (9 pgs), 2005.
European Search Report for International Application No. PCT/US2007/008842; (9 pgs), Oct. 5, 2007.
European Patent Office Communication, Appl No. /Patent No. 06256089.1-1242, dated Mar. 20, 2008, Reference JL36895P.EPP, (6 pgs).
"Heating, Ventilating, and air-Conditioning Applications", 1999 Ashrae Handbook, Atlanta, SI Edition, Chapter 47 - Water Treatment, http://www.ashrae.org, pp. 47.1-47.11 (12 pgs), 1999.
*European Patent Office; Communication Pursuant to Article 94 (3) EPC* for Application No. 07 755 1992.1201; Ref. JL 53728P EPP, dated Jun. 10, 2010 (4 pgs).
*USPTO; Notice of Allowance and Fee (s) Due* for U.S. Appl. No. 10/192,891 filed Jul. 11, 2002, in the name of Richard M. Weber; (6 pgs.), Date Mailed Sep. 12, 2005.
*USPTO; Office Action* for U.S. Appl. No. 10/192,891 filed Jul. 11, 2002, in the name of Richard M. Weber; (6 pgs.), Date Mailed Jan. 12, 2005.
*USPTO; Office Action* for U.S. Appl. No. 10/192,891 filed Jul. 11, 2002, in the name of Richard M. Weber; (5 pgs.), Date Mailed Mar. 4, 2004.
*USPTO; Office Action* for U.S. Appl. No. 10/192,891 filed Jul. 11, 2002, in the name of Richard M. Weber; (4 pgs.), Date Mailed Sep. 30, 2003.
*USPTO; Notice of Allowance and Fee (s) Due* for U.S. Appl. No. 10/440,716 filed May 19, 2003, in the name of William Gerald Wyatt; (6 pgs.), Date Mailed Jun. 1, 2005.
*USPTO; Final Office Action* for U.S. Appl. No. 10/440,716 filed May 19, 2003, in the name of William Gerald Wyatt; (6 pgs.), Date Mailed Mar. 3, 2005
*USPTO; Office Action* for U.S. Appl. No. 10/440,716 filed May 19, 2003, in the name of William Gerald Wyatt; (5 pgs.), Date Mailed Oct. 22, 2004.
*USPTO; Office Action* for U.S. Appl. No. 10/440,716 filed May 19, 2003, in the name of William Gerald Wyatt; (9 pgs.), Date Mailed Jun. 10, 2004.
*USPTO; Office Action*, U.S. Appl. No. 10/698,953, filed Oct. 31, 2003, in the name of Richard M. Weber; (5 pgs), Date Mailed Dec. 23, 2004.
*USPTO; Notice of Allowance and Fees Due*, U.S. Appl. No. 10/698,953, filed Oct. 31, 2003, in the name of Richard M. Weber; (7 pgs), Date Mailed Mar. 3, 2005.
*USPTO; Office Action*, for U.S. Appl. No. 10/867,331 filed Jun. 14, 2004, in the name of William G. Wyatt, (10 pgs.), Notification Date Jan. 19, 2010.
*USPTO; Final Office Action*, U.S. Appl. No. 10/867,331, in the name of William G. Wyatt, (11 pgs.), Notification Date May 17, 2010.
*USPTO; Non-Final Office Action*, U.S. Appl. No. 10/853,038, in the name of Richard M. Weber, (17 pgs), Notification Date Jul. 7, 2006.
*USPTO; Final Office Action*, U.S. Appl. No. 10/853,038, in the name of Richard M. Weber, (10 pgs), Notification Date Dec, 21, 2006.
*USPTO; Adv. Action*, U.S. Appl. No. 10/853,038, in the name of Richard M. Weber, (3 pgs), Notification Date Mar. 5, 2007.
*USPTO; Final Office Action*, U.S. Appl. No. 10/853,038, in the name of Richard M. Weber, (14 pgs), Notification Date Jun. 21, 2007.
*USPTO; Notice of Allowance and Fee (s) Due* for U.S. Appl. No. 11/058,691 filed Feb. 15, 2005, in the name of Richard Martin Weber; (5 pgs.), Date Mailed Apr. 9, 2007.

*USPTO; Office Action* for U.S. Appl. No. 11/058,691 filed Feb. 15, 2005, in the name of Richard Martin Weber; (5 pgs.), Notification Date Jan. 2, 2007.
*USPTO; Office Action* for U.S. Appl. No. 11/154,107 filed Jun. 15, 2005, in the name of Richard M. Weber; (6 pgs.), Date mailed Dec. 23, 2005.
*USPTO; Notice of Allowance and Fee (s) Due* for U.S. Appl. No. 11/154,107 filed Jun. 15, 2005, in the name of Richard M. Weber; (5 pgs.), Date Mailed May 17, 2006.
*USPTO; Office Action* for U.S. Appl. No. 11/371,681 filed Mar. 8, 2006, in the name of William G. Wyatt; (9 pgs.), Notification Date Dec. 10, 2009.
*USPTO; Office Action* for U.S. Appl. No. 11/371,681 filed Mar. 8, 2006, in the name of William G. Wyatt; (8 pgs.), Notification Date Aug. 5, 2009.
*USPTO; Office Action* for U.S. Appl. No. 11/371,681 filed Mar. 8, 2006, in the name of William G. Wyatt; (7 pgs.), Notification Date Jun. 8, 2010.
*USPTO; Advisory Action*, U.S. Appl. No. 11/371,681, filed Mar. 8, 2006, William G. Wyatt, (3 pg), Notification Date Aug. 23, 2010.
*USPTO; Office Action*, U.S. Appl. No. 11/291,041, in the name of Richard M. Weber, (12 pg), Date mailed Jul. 8, 2008.
*USPTO; Office Action*, U.S. Appl. No. 11/339,241, filed Jan. 24, 2006, in the name of Richard M. Weber, (10 pgs), Notification Date Oct. 9, 2007.
*USPTO; Office Action*, U.S. Appl. No. 11/339,241, filed Jan. 24, 2006, in the name of Richard M. Weber, (10 pgs), Notification Date Oct. 9, 2007.
*USPTO; Notice of Allowance and Fees Due*, U.S. Appl. No. 11/339,241, filed Jan. 24, 2006, in the name of Richard M. Weber, (7 pgs), Notification Date Jun. 15, 2009.
*USPTO; Office Action*, U.S. Appl. No. 11/339,241, filed Jan. 24, 2006, in the name of Richard M. Weber, (4 pg), Date mailed Aug. 6, 2007.
*USPTO; Office Action* for U.S. Appl. No. 11/859,591 filed Sep. 21, 2007, in the name of William G. Wyatt; (13 pgs.), Notification Date Aug. 3, 2009.
*USPTO; Final Office Action* for Appl. No. 11/859,591 filed Sep. 21, 2007, in the name of William G. Wyatt; (13 pgs.), Notification Date Feb. 18, 2010.
*USPTO; Notice of Allowance and Fee (s) Due* for U.S. Appl. No. 11/859,591 filed Sep. 21, 2007, in the name of William G. Wyatt; (4 pgs.), Date Mailed: Jul. 8, 2010.
*USPTO; Notice of Allowance and Fee (s) Due* for U.S. Appl. No. 11/533,219 filed Sep. 19, 2006, in the name of Richard M. Weber; (8 pgs.), Date Mailed Jan. 31, 2007.
Yamada et al., "*Subcooled Flow Boiling With Flow Pattern*", USPGPUB 2003/0053298 Al; (pp. 1-3); Mar. 19, 2002, Oct. 1979.
"Subcooled Flow Boiling With Flow Pattern Control" IBM Technical Disclosure Bulletin, vol. 22, Issue 5, pp. 1843-1844 - Oct. 1, 1979.
Margaret Ingels, (pp. 59 and 80 of Willis Haviland Carrier "*Father of Air Conditioning*", Country Life Press - Garden City (1952).
Dirk Van Orshoven, "*The use of water as a refrigerant—an exploratory investigation*", Thesis University Wisconsin, 1991, pp. I, III-XIII, 1-114. (133 pgs).
"An Integrated Thermal Architecture for Thermal Management of High Power Electronics", High Power Electronics, http:www.coolingzone.com/Guest/News/NL_JAN_2003/Thermacore/ Thermacore Jan. 2003, (22 pages).
Beaty, et al., "New Guidelines for Data Center Cooling", Dec. 2003; 8 pages.
Wilson, et al., "A Thermal Bus System for Cooling Electronic Components in High-Density Cabinets", 2004 AHSRAE Transactions; Symposia, pp. 567-573, 2004.
Center for the Analysis and Dissemination of Demonstrated Energy Technology (CADDET), Cooling plant at LEGO uses water as refrigerant, Sep. 1997.
Muller, Norbert, Ph.D., Turbo Chillers Using Water as a Refrigerant, Michigan State Univ., AMSE Process Industry Division Pid Newsletter, Fall 2002, p. 3.

Maab, Jurgen and Feddeck, Paul, MINE Projectinfo, BINE Informationsdienst, wasser als Kaltemittel, Aug. 2003; Translation Jan. 2007, "Water as Refrigerant".

Kharzi, A., Ph.D., Preliminary Study of a Novel R718 Turbo-Compression Cycle Using a 3-Port Condensing Wave Rotor, 2004 International ASME Turbo Exposition, ASME Paper GT2004-53622, Austria (8 pgs) Jun. 14-17, 2004.

Kharazi, et al., "Implementation of 3-Port Condensing Wave Rotors in R718 Cycles", Journal of Energy Resources Technology, Dec. 2006, vol. 128, pp. 325-334 (10 pg).

Karazi, et al. "An Application of Wave Rotor Technology for Performance Enhancement of R718 Refrigeration Cycles", The American Institute of Aeronautics and Astronautics, Inc., Rhode Island, (AIAA 2004-5636) pp. 965-977 (13 pg), Aug. 16-19, 2004.

Kharazi, et al., "Performance Benefits of R718 Turbo-Compression Cycle Using 3-Port Condensing Wave Rotors", Proceedings of IMECE04; 2004 ASME International Mechanical Engineering Congress and Exposition, Calif, IMECE2004-60992; Nov. 13-19, 2004, pp. 167-176 (10 pg).

Kharazi, et al., "Preliminary Study of a Novel R718 Compression Refrigeration Cycle Using a Three-Port Condensing Wave Rotor", Journal of Engineering for Gas Turbines and Power, Jul. 2005, vol. 127, pp. 539-544 (6 pg).

Akbari, et al., "A Review of Wave Rotor Technology and Its Applications", Proceedings of IMEC04, 2004 ASME International Mechanical Engineering Congress and Exposition, Nov. 13-19, 2004, IMECE2004-60082, pp. 81-103. (23 pgs).

Kilicarslan, et al., "A comparative study of water as a refrigerant with some current refrigerants", International Journal of Energy Research, pp. 948-959. (13 pgs), 2005.

Akbari, et al., "Utilizing Wave Rotor Technology to Enhance the Turbo Compression in Power and Refrigeration Cycles", Proceedings of IMECE'03, 2003 ASME International Mechanical Engineering, Nov. 16-21, 2003. (9 pgs).

Application Bulletin #16; "Water Purity Requirements in Liquid Cooling Systems;" Jun. 12, 1995; (4 pages ).

* cited by examiner

SYSTEMS AND METHODS FOR COOLING A COMPUTING COMPONENT IN A COMPUTING RACK

RELATED APPLICATIONS

This application claims the benefit under 35 U.S.C. §119(e) of U.S. Provisional Application No. 61/039,376 filed Mar. 25, 2008, entitled "Cooling System for a Computing Rack."

TECHNICAL FIELD OF THE DISCLOSURE

This disclosure generally relates to cooling systems, and more particularly, to systems and methods for cooling a computing component in a computing rack.

BACKGROUND OF THE DISCLOSURE

Relatively large computing systems, such as computing clusters, Internet data centers, and public switched telephone network (PSTN) central office switches, may include numerous computing components. Examples of computing components may include servers, routers, network switches, cable interconnect boxes, power supplies, or rack-mount personal computers. These computing components may be contained in computing racks that house multiple computing components. The heat generated by the electronics within the computing components may be significant, and it may be desirable to cool the computing components by removing the heat they generate.

SUMMARY OF THE DISCLOSURE

According to one embodiment, a system for cooling computing components includes a computing rack housing a plurality of computing components of a computing system. A heat absorbing plate is disposed in and removable from the computing rack. The heat absorbing plate is thermally coupled to an outer surface of a computing component and comprises a plurality of walls defining a cavity containing a two-phase coolant. The cavity has a continuous volume allowing the two-phase coolant to absorb heat from the computing component and to transfer the heat to a heat transfer mechanism. The computing rack has a sidewall that is thermally coupled to the heat absorbing plate and comprises the heat transfer mechanism, which is operable to receive the heat transferred from the heat absorbing plate.

Numerous technical advantages are provided according to various embodiments of the present disclosure. In certain embodiments, a continuous thermal path through a two-phase coolant may allow heat to be removed from computing components contained in a computing rack.

Further technical advantages of certain embodiments may include the ability to remove one or more servers without disturbing the heat absorbing plate or other cooling components of the computer rack. Also, because the heat absorbing plate comprises a contained continuous volume, according to certain embodiments it may also be removed without causing a leak in the system.

Still further technical advantages of certain embodiments may include efficient removal of heat from computing components through a continuing thermal path that uses sidewalls of a computing rack. A cooling system in accordance with the teachings of certain embodiments of the present disclosure may dissipate approximately three kilowatts of heat.

Other technical advantages of the present disclosure will be readily apparent to one skilled in the art from the following figures, descriptions, and claims. Moreover, while specific advantages have been enumerated above, various embodiments may include all, some, or none of the enumerated advantages.

BRIEF DESCRIPTION OF THE DRAWINGS

A more complete understanding of embodiments of the disclosure will be apparent from the detailed description taken in conjunction with the accompanying drawings in which.

DETAILED DESCRIPTION OF EXAMPLE EMBODIMENTS

It should be understood at the outset that although example embodiments of the present invention are illustrated below, the present invention may be implemented using any number of techniques, whether currently known or in existence. The present invention should in no way be limited to the example embodiments, drawings, and techniques illustrated below, including the embodiments and implementation illustrated and described herein. Additionally, the drawings are not necessarily drawn to scale.

The physical configuration of computing systems may be important for their proper operation. To organize computing systems having numerous electrical components, computing racks have been developed. Most commonly computing racks are usually referred to as 19-inch racks and 23-inch racks. 19-inch racks may be constructed according to various specifications, such as the Electronics Industries Alliance 310-D (EIA 310D) specification. Although 23-inch racks are often used by the telecommunication industry, 19-inch racks may be relatively more common with other computing system applications.

Computing racks may be designed to allow cooling of the various components configured inside. Known cooling systems for computing racks have included convection air cooling systems using chilled air from vapor cycle air conditioning systems. These convection air cooling systems, however, may be relatively complicated and expensive to operate.

Figure 1A:
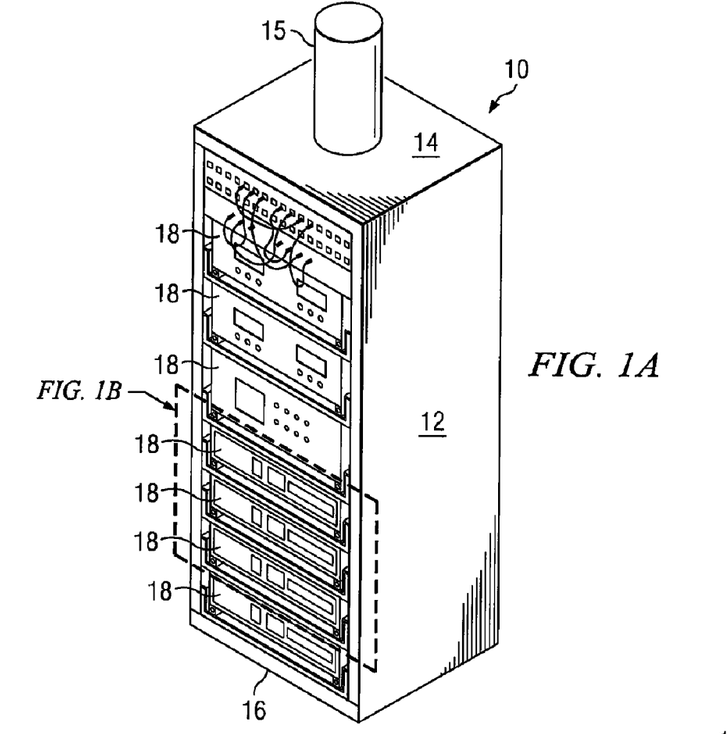
FIG. 1A is an environmental view of a computing rack in accordance with an embodiment of the present disclosure.

FIG. 1A shows an example of a server or computing rack 10 according to an embodiment of the present disclosure. Computing rack 10 includes a number of sidewalls 12, a top 14, and a bottom 16 forming a box-like structure in which a number of computing components 18 of a computing system may be disposed. Computing components 18 may be any suitable number and type of computing components forming a computing system such as those described above. As will be described below, computing components 18 may include electronic heat generating components whose heat energy may be removed by a cooling system in accordance with the teachings of the present disclosure.

In certain embodiments, heat energy may be transferred from computing components 18 through sidewalls 12 or a back of computing rack 10 to a heat pipe 15. Heat pipe 15 may transfer the heat through to an attic region where cool air may be blown on a top portion of heat pipe 15 creating a cool portion. In certain embodiments, heat pipe 15 may be two to three inches in diameter and may be approximately fifteen to twenty feet long. In other embodiments, heat pipe 15 may be sized differently. There may be one heat pipe 15 for each computing rack 10. Heat pipe 15 may operate as a conventional heat pipe where a coolant is vaporized and transferred from a hot end near computing rack 10 to a cooler top end where the coolant may condense. Heat pipe 15 may absorb heat from sidewalls 12 in order to keep computing components 18 at a relatively cool temperature. In certain embodiments, heat from computing components 18 may be transferred to the back walls of computing rack 10, and these walls may be cooled by heat pipe 15. Smaller heat pipes contained within sidewalls 12 may also be used to transfer heat to larger heat pipe 15 in accordance with an embodiment of the present disclosure.

Figure 1B:
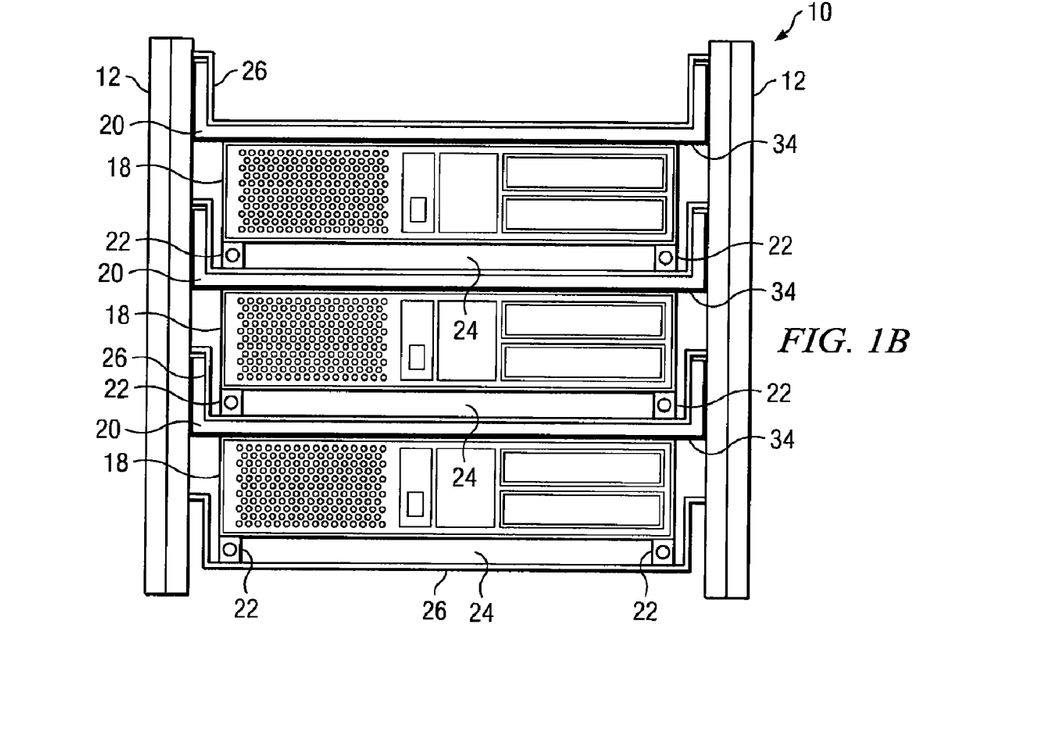
FIG. 1B is a front view of multiple computing components that may be cooled according to an embodiment of the present disclosure.

FIG. 1B is a front view of multiple computing components that may be cooled according to an embodiment of the present disclosure. Each computing component 18 may be thermally coupled to a heat absorbing plate 20 and electrically connected from the rear of computing component 18 to a back of computing rack 10. Electrical connections may also be made at the front of computing component 18. In certain embodiments, the electrical connections may be made with cable to provide positional flexibility of the location of computing component 18 within computing rack 10. Thermal coupling of computing component 18 to heat absorbing plane 20 may be enhanced by interface material 34.

Computing component 18 may also be thermally coupled to heat absorbing plate 20 by biasing computing component 18 against heat absorbing plate 20 using biasing apparatus 22. In certain embodiments, biasing apparatus 22 may be in the form of a three, five, or seven section wedge lock and may extend approximately from a front end to a back end of computing component 18 (see FIG. 1C). Certain embodiments may not include a wedge lock, but rather may include any suitable device for biasing computing component 18 toward heat absorbing plate 20. In certain embodiments, biasing apparatus 22 may be made of aluminum or other material suitable for conducting heat.

Figure 1C:
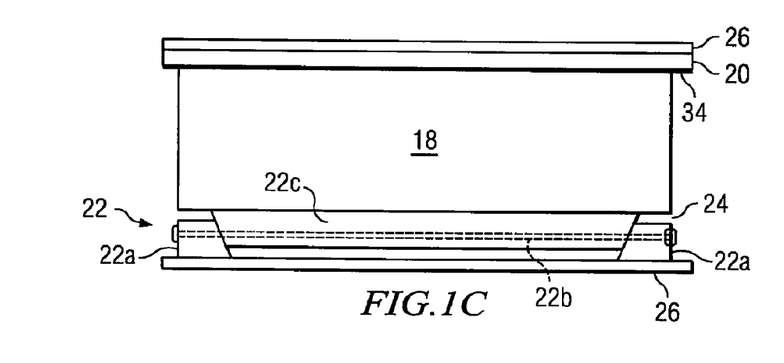
FIG. 1C is a side view of a computing component and a biasing apparatus according to an embodiment of the present disclosure.

Computing component 18 may be inserted into computing rack 10 and electrically connected. Then, as shown in FIG. 1C, one or more biasing apparatuses 22 may be manipulated to physically force computing component 18 toward heat absorbing plate 20 such that thermal energy or heat from computing component 18 may be conducted by heat absorbing plate 20. For example, biasing apparatus 22 may include wedge members 22a on either side of a center member 22c. Connecting wedge members 22a may be screw 22b. By tightening screw 22b, wedge members 22a may be pulled together. This action may force center member 22c in an upward direction as wedge members 22a slide under center member 22c. Because computing component 18 may be resting on biasing apparatus 22, the action of center member 22c moving upwards would cause computing component 18 to also move upwards. By continuing to tighten screw 22b, computing component 18 may be moved upwards such that it comes in thermal contact with heat absorbing plate 20 through interface material 34.

Removal of computing component 18 may be provided by reversing the previously described procedure such that computing component 18 may be lowered and removed from computing rack 10 without altering the cooling characteristics of computing rack 10.

In the particular embodiment shown, each heat absorbing plate 20 may be disposed adjacent a support structure 26. Support structure 26 may be made of aluminum or other heat conducting material. In other embodiments, heat absorbing plate 20 may be integrally formed with support structure 26 such that heat absorbing plate 20 provides structural support while also removing heat from its respective computing component 18.

In the embodiment illustrated in FIG. 1A, one or more biasing apparatuses 22 may be coupled to support structure 26. Computing component 18 may be disposed on biasing apparatuses 22 and biased upward as previously described. By using biasing apparatuses 22 and biasing computing component 18 upward toward heat absorbing plate 18, a gap 24 may be created between a bottom surface of computing component 18 and a top surface of support structure 26. Gap 24 may allow for easy removal of computing component 18. Gap 24 and the adjustability of biasing apparatuses 22 may also allow for different sized computing components 18 to be inserted in and removed from computing rack 10.

Figure 1D:
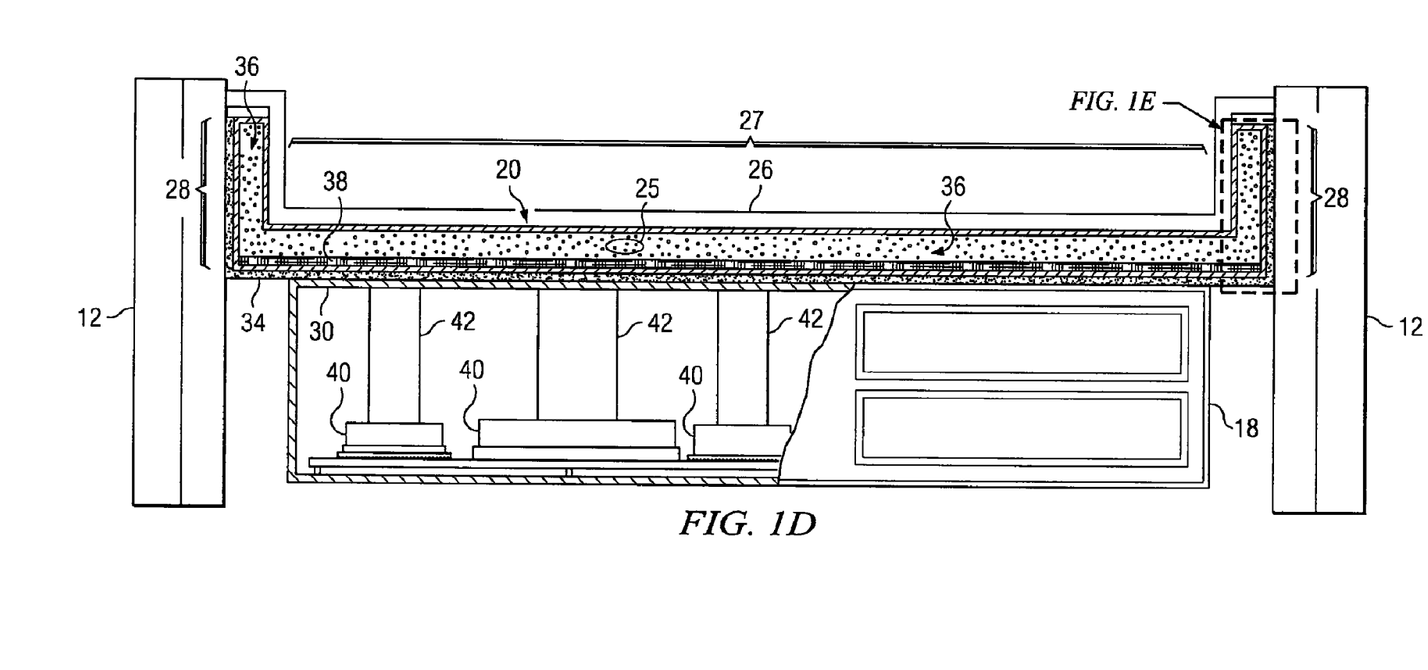
FIG. 1D is a front view of a computing component with portions cut-away to reveal portions of a cooling system according to an embodiment of the present disclosure.

FIG. 1D illustrates computing component 18 and heat absorbing plate 20 with portions cut away to reveal certain heat transfer features. Heat absorbing plate 20 may operate essentially like a flat heat pipe in certain embodiments. In certain embodiments, heat absorbing plate 20 may comprise a horizontal portion 27 that absorbs heat from computing component 18 and a vertical portion 28 that transfers the heat from heat absorbing plate 20 to sidewall 12. Vertical portion 28 may add increased surface area to facilitate improved heat transfer to sidewall 12. As will be described in further detail below, sidewall 12 may contain one or more heat pipes, one or more cold plates, or a portion of a sub-ambient pressure cooling system 210 (see FIG. 2) in accordance with the teachings of the present disclosure.

Figure 1E:
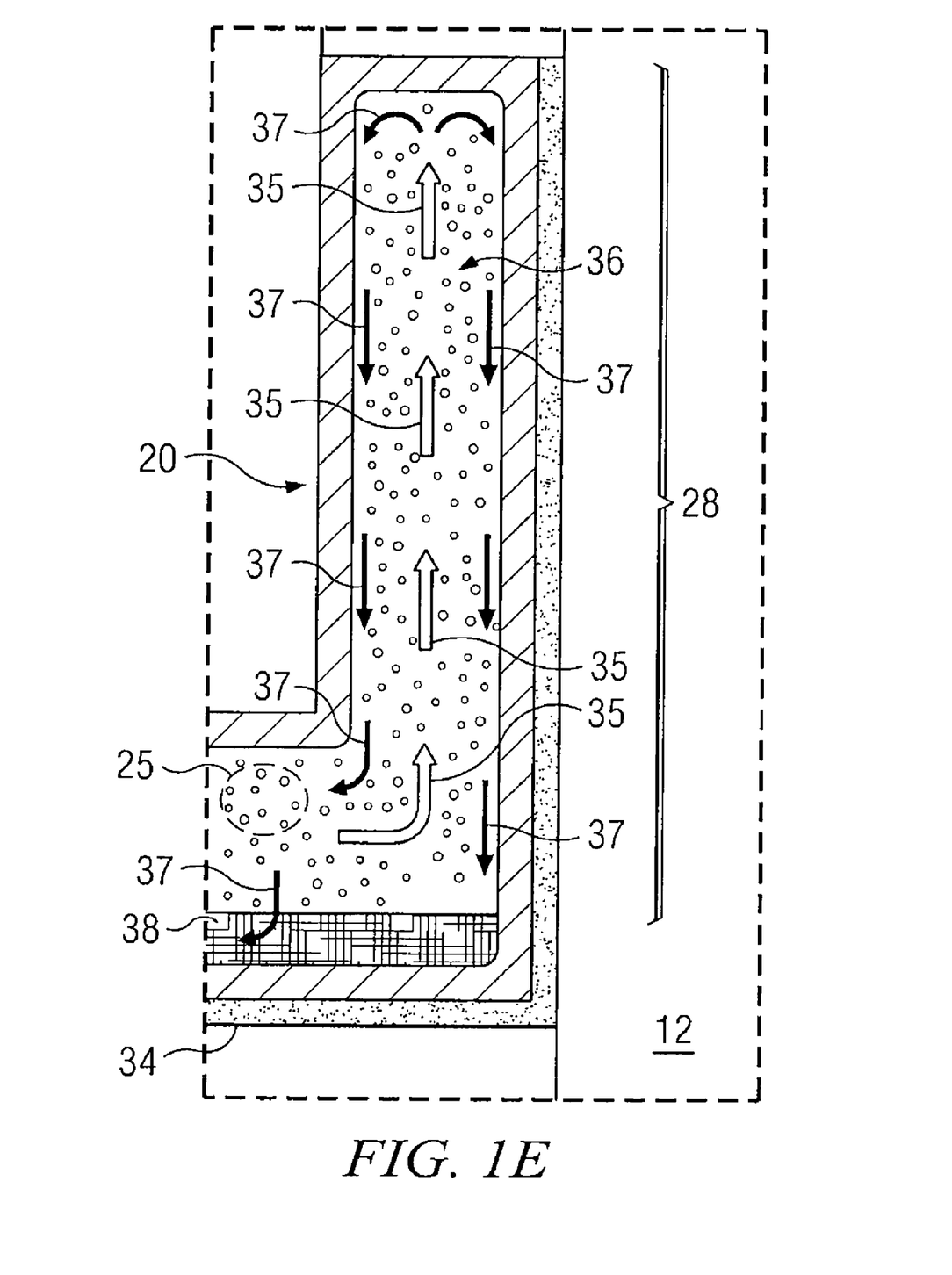
FIG. 1E is a front view showing a portion of FIG. 1D with portions cut-away to reveal portions of a cooling system according to an embodiment of the present disclosure.

The horizontal portion 27 and vertical portion 28 of heat absorbing plate 20 may be a continuous volume containing a coolant 25. The coolant 25 may be alcohol, water, ammonia, other suitable coolants, or combinations of the preceding. In certain embodiments, water may be used as coolant 25 contained in a cavity 36 of heat absorbing plate 20. Heat absorbing plate 20 may be located above computing component 18 to allow gravity to operate on the coolant and bring it in close proximity to computing component 18. Because coolant 25 is subjected to less than atmospheric pressure, heat energy from computing component 18 may vaporize coolant 25 in close proximity to computing component 18. As illustrated in FIG. 1E, this vapor may move in vapor direction 35 toward the cooler portion of heat absorbing plate 20, which may be the vertical portion 28 which is being cooled by the cooling system contained in sidewall 12. At this point, the vapor would condense and recirculate in liquid direction 37 in the closed volume of heat absorbing plate 20.

In certain embodiments, a wicking material 38 may be used in heat absorbing plate 20 to ensure that coolant 25 is spread along the inside bottom surface of the horizontal portion of heat absorbing plate 20. Wicking material 38 may use capillary action to move coolant 25 in its liquid phase along a bottom surface of heat absorbing plate 20.

In one embodiment, one or more sidewalls 12 may be thermally coupled to vertical portion 28 of heat absorbing plate 20. By physically coupling vertical portion of heat absorbing plate 20 to sidewall 12 using any suitable fastening means, such as bolts or screws, heat absorbing plate 20 may be removed and replaced if it is cracked or damaged.

Computing component 18 may have a heat conduction path from an electrical component 40 to a base 30 of computing component 18. In certain embodiments, the heat conduction path may be through heat pipes 42 as illustrated in FIG. 1D. In other embodiments, the thermal path may be through metal-to-metal contact within computing component 18. In still other embodiments, any suitable configuration that provides a heat conduction path to transfer thermal energy from electrical components 40 to base 30 may be used according to embodiments of the present disclosure.

Electrical components 40 may generate heat when operating. For example, an electrical component 40 may be a central processing unit that generates heat that can be transferred, which will cool electrical component 40 in accordance with embodiments of the present disclosure. Thermal energy from electrical components 40 that is transferred via heat pipes 42 to base 30 may be absorbed by heat absorbing plate 20 and transferred to sidewalls 12 in accordance with embodiments of the present disclosure.

An interfacing layer 34 may be disposed between base 30 and heat absorbing plate 20 to promote heat transfer from base 30 to heat absorbing plate 20. Interfacing layer 34 may include any thermally conductive material, such as thermal grease or cotherm, that provides relatively good conformity with the surface of base 30, and heat absorbing plate 20, and sidewalls 12. Interfacing layer 34 may promote efficient heat transfer by removing air voids between adjacent components. Interfacing layers 34 may have any thickness to thermally couple their respective surfaces to one another. Interfacing layers 34 having a thickness of approximately 5 to 10 milli-inches may be sufficient to provide this thermal coupling.

As shown, heat absorbing plate 20 may be coupled to the upper surface of computing component 18 to enhance the natural movement of heat, which is generally upwards in direction. Heat absorbing plate 20 may also be mounted to the bottom surface of shelf 26 to provide for direct contact of heat absorbing plate 20 with the upper surface of computing component 18.

In certain embodiments, sidewalls 12 may be in thermal communication with heat pipe 15. In other embodiments, sidewalls 12 may contain sub-ambient pressure cooling system 210 in accordance with certain embodiments of the present disclosure. For example, FIG. 2 is a block diagram of an embodiment of a cooling system 210 that may be used to cool sidewalls 12.

Figure 2:
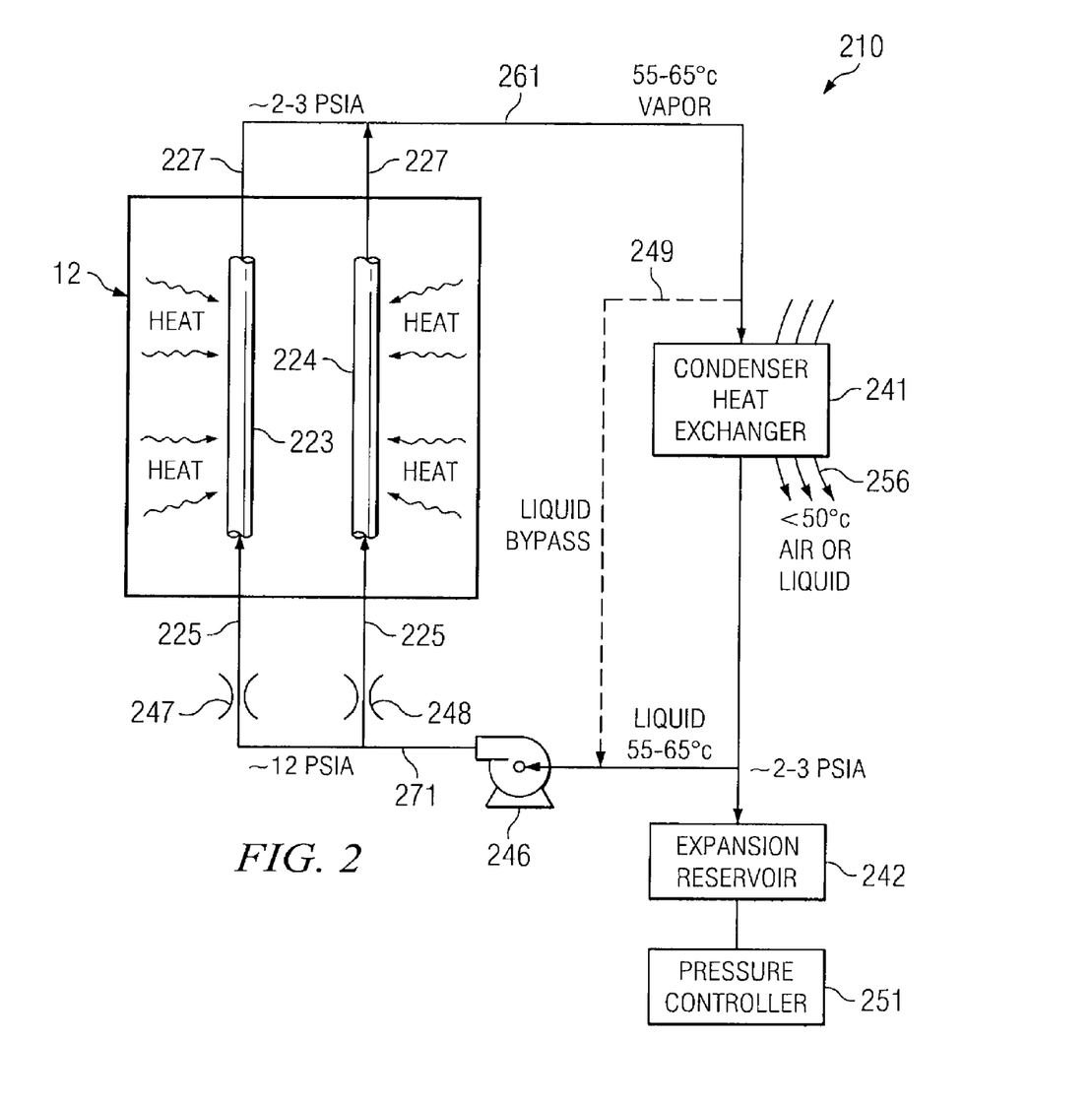
FIG. 2 is a block diagram of an embodiment of a sub-ambient pressure cooling system according to an embodiment of the present disclosure.

The cooling system 210 of FIG. 2 is shown cooling a sidewall 12 to keep the vertical portions 28 of heat absorbing plate 20 cool. The cooling system 210 of FIG. 2 includes a vapor line 261, a liquid line 271, heat exchangers 223 and 224, a pump 246, inlet orifices 247 and 248, a condenser heat exchanger 241, an expansion reservoir 242, and a pressure controller 251.

Sidewalls 12 may be arranged and designed to conduct heat or thermal energy away from heat absorbing plate 20 to the heat exchangers 223, 224. To receive this thermal energy or heat, the heat exchanger 223, 224 may be disposed internal to sidewall 12 and may extend through portions of sidewall 12, for example, through a thermal plane of sidewall 12. Although two heat exchangers 223, 224 are shown in the cooling system 210 of FIG. 2, one heat exchanger or more than two heat exchangers may be used to cool sidewalls 12 in other cooling systems.

In operation, a fluid coolant flows through each of the heat exchangers 223, 224. As discussed later, this fluid coolant may be a two-phase fluid coolant, which enters inlet conduits 225 of heat exchangers 223, 224 in liquid form. Absorption of heat from heat absorbing plate 20 causes part or all of the liquid coolant to boil and vaporize such that some or all of the fluid coolant leaves the exit conduits 227 of heat exchangers 223, 224 in a vapor phase. To facilitate such absorption or transfer of thermal energy, the heat exchangers 223, 224 may be lined with pin fins or other similar devices which, among other things, increase surface contact between the fluid coolant and walls of the heat exchangers 223, 224. Additionally, in particular embodiments, the fluid coolant may be forced or sprayed into the heat exchangers 223, 224 to ensure fluid contact between the fluid coolant and the walls of the heat exchangers 223, 224.

The fluid coolant departs the exit conduits 227 and flows through the vapor line 261, the condenser heat exchanger 241, the expansion reservoir 242, a pump 246, the liquid line 271, and a respective one of two orifices 247 and 248, in order to again reach the inlet conduits 225 of the heat exchanger 223, 224. The pump 246 may cause the fluid coolant to circulate around the loop shown in FIG. 2. In particular embodiments, the pump 246 may use magnetic drives so there are no shaft seals that can wear or leak with time. Although the vapor line 261 uses the term "vapor" and the liquid line 271 uses the terms "liquid", each respective line may have fluid in a different phase. For example, the liquid line 271 may have contain some vapor and the vapor line 261 may contain some liquid.

The orifices 247 and 248 in particular embodiments may facilitate proper partitioning of the fluid coolant among the respective heat exchanger 223, 224, and may also help to create a large pressure drop between the output of the pump 246 and the heat exchanger 223, 224 in which the fluid coolant vaporizes. The orifices 247 and 248 may have the same size, or may have different sizes in order to partition the coolant in a proportional manner which facilitates a desired cooling profile.

A flow 256 of fluid (either gas or liquid) may be forced to flow through the condenser heat exchanger 241, for example by a fan (not shown) or other suitable device. In particular embodiments, the flow 256 of fluid may be ambient fluid. The condenser heat exchanger 241 transfers heat from the fluid coolant to the flow 256 of ambient fluid, thereby causing any portion of the fluid coolant which is in the vapor phase to condense back into a liquid phase. In particular embodiments, a liquid bypass 249 may be provided for liquid fluid coolant that either may have exited the heat exchangers 223, 224 or that may have condensed from vapor fluid coolant during travel to the condenser heat exchanger 241. In particular embodiments, the condenser heat exchanger 241 may be a cooling tower.

The liquid fluid coolant exiting the condenser heat exchanger 241 may be supplied to the expansion reservoir 242. Since fluids typically take up more volume in their vapor phase than in their liquid phase, the expansion reservoir 242 may be provided in order to take up the volume of liquid fluid coolant that is displaced when some or all of the coolant in the system changes from its liquid phase to its vapor phase. The amount of the fluid coolant which is in its vapor phase can vary over time, due in part to the fact that the amount of heat or thermal energy being received by sidewalls 12 will vary over time, as computing rack 10 and computing components 18 operate in various operational modes.

Turning now in more detail to the fluid coolant, one highly efficient technique for removing heat from a surface is to boil and vaporize a liquid which is in contact with a surface. As the liquid vaporizes in this process, it inherently absorbs heat to effectuate such vaporization. The amount of heat that can be absorbed per unit volume of a liquid is commonly known as the latent heat of vaporization of the liquid. The higher the latent heat of vaporization, the larger the amount of heat that can be absorbed per unit volume of liquid being vaporized.

The fluid coolant used in the embodiment of FIG. 2 may include, but is not limited to, mixtures of antifreeze and water or water, alone. In particular embodiments, the antifreeze may be ethylene glycol, propylene glycol, methanol, or other suitable antifreeze. In other embodiments, the mixture may also include fluoroinert. In particular embodiments, the fluid coolant may absorb a substantial amount of heat as it vaporizes, and thus may have a very high latent heat of vaporization.

Water boils at a temperature of approximately 100° C. at an atmospheric pressure of 14.7 pounds per square inch absolute (psia). In particular embodiments, the fluid coolant's boiling temperature may be reduced to between 55-65° C. by subjecting the fluid coolant to a subambient pressure of about 2-3 psia. Thus, in the cooling system 210 of FIG. 2, the orifices 247 and 248 may permit the pressure of the fluid coolant downstream from them to be substantially less than the fluid coolant pressure between the pump 246 and the orifices 247 and 248, which in this embodiment is shown as approximately 12 psia. The pressure controller 251 maintains the coolant at a pressure of approximately 2-3 psia along the portion of the loop which extends from the orifices 247 and 248 to the pump 246, in particular through the heat exchangers 223 and 224, the condenser heat exchanger 241, and the expansion reservoir 242. In particular embodiments, a metal bellows may be used in the expansion reservoir 242, connected to the loop using brazed joints. In particular embodiments, the pressure controller 251 may control loop pressure by using a motor driven linear actuator that is part of the metal bellows of the expansion reservoir 242 or by using small gear pump to evacuate the loop to the desired pressure level. The fluid coolant removed may be stored in the metal bellows whose fluid connects are brazed. In other configurations, the pressure controller 251 may utilize other suitable devices capable of controlling pressure.

In particular embodiments, the fluid coolant flowing from the pump 246 to the orifices 247 and 248 through liquid line 271 may have a temperature of approximately 55° C. to 65° C. and a pressure of approximately 12 psia as referenced above. After passing through the orifices 247 and 248, the fluid coolant may still have a temperature of approximately 55° C. to 65° C., but may also have a lower pressure in the range about 2 psia to 3 psia. Due to this reduced pressure, some or all of the fluid coolant will boil or vaporize as it passes through and absorbs heat from the heat exchanger 223 and 224.

After exiting the exits ports 227 of the heat exchanger 223, 224, the subambient coolant vapor travels through the vapor line 261 to the condenser heat exchanger 241 where heat or thermal energy can be transferred from the subambient fluid coolant to the flow 256 of fluid. The flow 256 of fluid in particular embodiments may have a temperature of less than 50° C. In other embodiments, the flow 256 may have a temperature of less than 40° C. As heat is removed from the fluid coolant, any portion of the fluid which is in its vapor phase will condense such that substantially all of the fluid coolant will be in liquid form when it exits the condenser heat exchanger 241. At this point, the fluid coolant may have a temperature of approximately 55° C. to 65° C. and a subambient pressure of approximately 2 psia to 3 psia. The fluid coolant may then flow to pump 246, which in particular embodiments 246 may increase the pressure of the fluid coolant to a value in the range of approximately 12 psia, as mentioned earlier. Prior to the pump 246, there may be a fluid connection to an expansion reservoir 242 which, when used in conjunction with the pressure controller 251, can control the pressure within the cooling loop.

It will be noted that the embodiment of FIG. 2 may operate without a refrigeration system. In the context of electronic circuitry, such as may be utilized in computing rack 10, the absence of a refrigeration system can result in a significant reduction in the size, weight, and power consumption of the structure provided to cool the heat generating components 40 of computing component 18.

Figure 3:
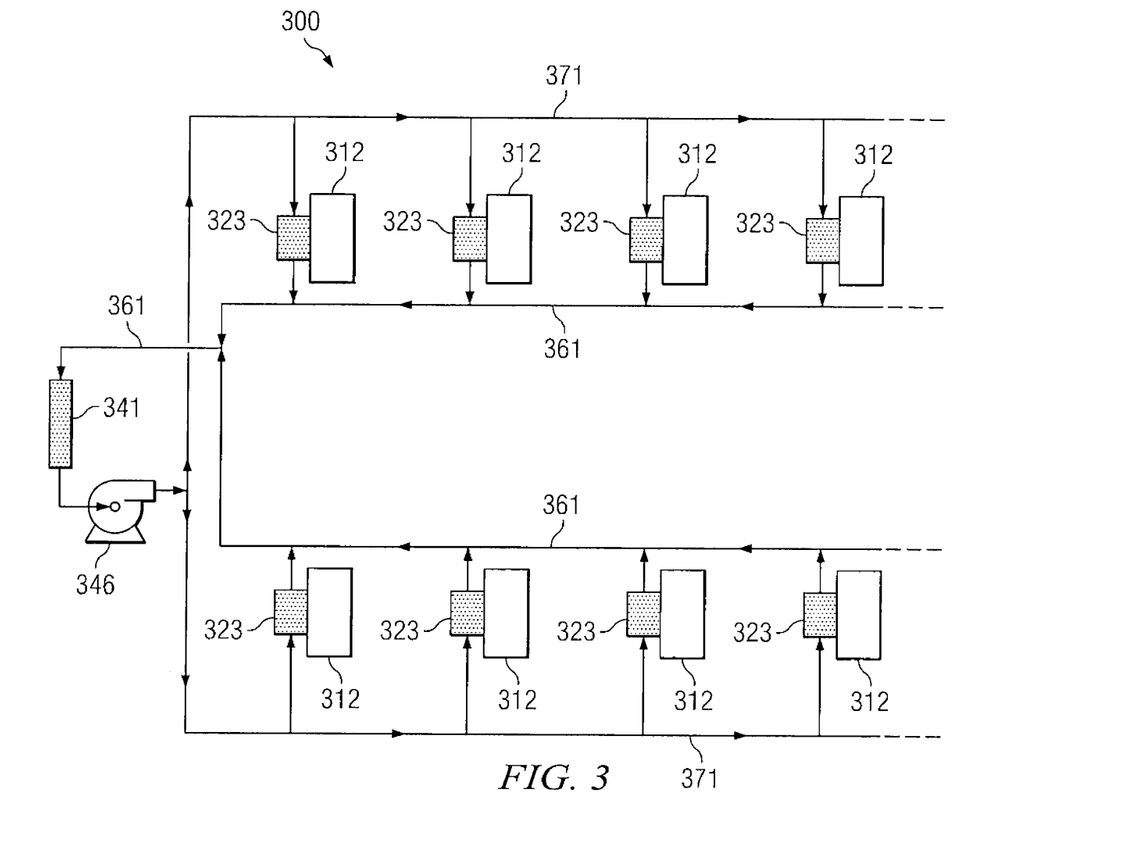
FIG. 3 is a block diagram of an embodiment of a cooling system that may be used to cool a plurality of computing racks according to an embodiment of the present disclosure.

FIG. 3 is a block diagram of a cooling system 300, according to an embodiment of the present disclosure. The cooling loop for the cooling system 300 may operate in a similar manner to the cooling loops for the cooling system 210 of FIG. 2, for example, including a heat exchangers 323, a pump 346, a liquid line 371, a vapor line 361, and a condenser heat exchanger 341. The cooling system 300 may be used to cool a plurality of servers or structures 312, for example, computing racks 10 in a data center.

In operation, computing components of the each of servers or structures 312 may generate thermal energy, which is dissipated to the heat exchanger 312. Each of the heat exchangers 323 of the servers or structures 312 may interact with a common liquid line 371 and a common vapor line 361. Each of the heat exchangers 323 receives fluid in a substantially liquid state through the liquid line 371 and vaporizes the fluid in the heat exchanger 323. The fluid exits the heat exchanger 323 in a substantially vapor state to the vapor line 361.

In particular embodiments, the servers or structures 312 may be located inside a building while the condenser heat exchanger 341 and/or pump 346 may be located outside of a building.

Although the present disclosure has been described with several embodiments, a myriad of changes, variations, alterations, transformations, and modifications may be suggested to one skilled in the art, and it is intended that the present disclosure encompass such changes, variations, alterations, transformation, and modifications as they fall within the scope of the appended claims.

What is claimed is:

1. A system for cooling computing components, comprising:
    a computing rack housing a plurality of computing components of a computing system;
    a heat absorbing plate disposed in and being removable from the computing rack, the heat absorbing plate being thermally coupled to an outer surface of a computing component of the plurality of computing components, the heat absorbing plate comprising:
        a first portion thermally coupled to an outer surface of the computing component, and
        a second portion being thermally coupled to a heat transfer mechanism, the first portion being generally perpendicular to the second portion, the first portion and the second portion defining a continuous cavity containing a two-phase coolant and allowing the two-phase coolant to absorb heat from the computing component and to transfer the heat to the heat transfer mechanism; and
    a sidewall of the computing rack being thermally coupled to the second portion of the heat absorbing plate and comprising the heat transfer mechanism, the heat transfer mechanism being operable to receive the heat transferred from the heat absorbing plate.

2. The system of claim 1, further comprising a wicking material disposed in the cavity.

3. The system of claim 1, further comprising an interface material disposed between the outer surface of the computing component and the heat absorbing plate, the interface material reducing or removing air voids between the outer surface of the computing component and the heat absorbing plate.

4. A system for cooling computing components, comprising:
- a computing rack housing a plurality of computing components of a computing system;
- a heat absorbing plate disposed in the computing rack and being thermally coupled to an outer surface of a computing component of the plurality of computing components, the heat absorbing plate comprising:
  - a first portion thermally coupled to an outer surface of the computing component, and
  - a second portion being thermally coupled to a heat transfer mechanism, the first portion being generally perpendicular to the second portion, the first portion and the second portion defining a continuous cavity containing a two-phase coolant operable to remove heat from the computing component; and
- a sidewall of the computing rack being thermally coupled to the second portion of the heat absorbing plate and comprising the heat transfer mechanism operable to remove heat from the heat absorbing plate.

5. The system of claim 4, wherein the heat transfer mechanism comprises a heat pipe.

6. The system of claim 4, wherein the heat transfer mechanism comprises a portion of a sub-ambient pressure cooling system.

7. The system of claim 6, wherein the portion of the sub-ambient pressure cooling system comprises:
- a heat exchanger disposed in the sidewall, the heat exchanger being in thermal communication with the heat absorbing plate, the heat exchanger having an inlet and an outlet, the inlet operable to receive fluid coolant into the heat exchanger substantially in the form of a liquid, and the outlet operable to dispense fluid coolant out of the heat exchanger substantially in the form of a vapor, the fluid coolant in the heat exchanger being subjected to a sub-ambient pressure.

8. The system of claim 4, wherein a plurality of walls of the heat absorbing plate define a cavity that contains the two-phase coolant, the cavity being a continuous volume allowing the two-phase coolant to absorb heat from the computing component and to transfer the heat to the heat transfer mechanism.

9. The system of claim 8, further comprising a wicking material disposed in the cavity.

10. The system of claim 4, wherein the outer surface of the heat absorbing plate is an upper surface of the computing component.

11. The system of claim 4, wherein the computing rack comprises a support structure, and wherein the computing component and the support structure define a gap, the gap allowing removal of the computing component.

12. The system of claim 11, further comprising one or more biasing apparatuses coupled to the support structure, the biasing apparatuses creating the gap by biasing the computing component toward the heat absorbing plate.

13. The system of claim 4, wherein the heat absorbing plate is removable from the computing rack.

14. The system of claim 4, further comprising an interface material disposed between the outer surface of the computing component and the heat absorbing plate, the interface material reducing or removing air voids between the outer surface of the computing component and the heat absorbing plate.

15. The system of claim 4, wherein the heat absorbing plate is a heat pipe.

16. A method of cooling a computing component, comprising:
- providing an electronic heat generating component within a computing component, the computing component being contained within a computing rack;
- transferring heat generated by the electronic component to a base of the computing component;
- transferring the heat from the base to a heat absorbing plate, the heat absorbing plate comprising:
  - a first portion thermally coupled to an outer surface of the computing component, and
  - a second portion being thermally coupled to a heat transfer mechanism, the first portion being generally perpendicular to the second portion, the first portion and the second portion defining a continuous cavity containing a two-phase coolant, the heat vaporizing the coolant;
- transferring the heat from the second portion of the heat absorbing plate to the heat transfer mechanism within a sidewall of the computing rack; and
- removing the heat from the computing rack by the heat transfer mechanism.

17. The method of claim 16, wherein the heat transfer mechanism comprises a heat pipe, and removing the heat from the computing rack comprises vaporizing a second two-phase coolant in the heat pipe.

18. The method of claim 16, wherein the heat transfer mechanism comprises a heat exchanger disposed in the sidewall of the computing rack and removing the heat from the computing rack comprises:
- transferring the heat to the heat exchanger, the heat exchanger being in thermal communication with the heat absorbing plate, the heat exchanger having an inlet and an outlet, the inlet operable to receive fluid coolant into the heat exchanger substantially in the form of a liquid, and the outlet operable to dispense fluid coolant out of the heat exchanger substantially in the form of a vapor, the fluid coolant in the heat exchanger being subjected to a sub-ambient pressure.

19. The method of claim 16, further comprising communicating the two-phase coolant in a liquid phase within the heat absorbing plate using a wicking material, the wicking material using capillary action to communicate the liquid phase coolant.

20. The method of claim 16, further comprising creating a gap between the computing component and a support structure by biasing the computing component toward the heat absorbing plate using at least one biasing apparatus.

21. The method of claim 20, further comprising biasing the computing component away from the heat absorbing plate using the at least one biasing apparatus to allow the computing component to be removed from the computing rack.

22. The method of claim 16, further comprising:
- transferring the heat from the computing component to the heat absorbing plate through an interface material; and
- transferring the heat from the heat absorbing plate to the heat transfer mechanism through the interface material, the interface material reducing or removing air voids between the heat absorbing plate and the computing component and reducing or removing air voids between the heat absorbing plate and the sidewall.

* * * * *